(12) United States Patent
Zundel et al.

(10) Patent No.: US 6,911,693 B2
(45) Date of Patent: Jun. 28, 2005

(54) MOS TRANSISTOR DEVICE

(75) Inventors: Markus Zundel, Taufkirchen (DE); Franz Hirler, Isen (DE)

(73) Assignee: Infineon Technologies AG, Munich (DE)

(*) Notice: Subject to any disclaimer, the term of this patent is extended or adjusted under 35 U.S.C. 154(b) by 84 days.

(21) Appl. No.: 10/446,600

(22) Filed: May 28, 2003

(65) Prior Publication Data

US 2004/0026737 A1 Feb. 12, 2004

(30) Foreign Application Priority Data

May 28, 2002 (DE) .......................................... 102 23 699

(51) Int. Cl.[7] .............................................. H01L 29/00
(52) U.S. Cl. ...................................... 257/332; 257/409
(58) Field of Search ................................ 257/332, 330, 257/339, 340, 341, 409

(56) References Cited

U.S. PATENT DOCUMENTS

| 5,072,266 A | 12/1991 | Bulucea et al. ............. 257/409 |
| 5,742,076 A | 4/1998 | Sridevan et al. ............ 257/341 |
| 6,037,628 A * | 3/2000 | Huang ......................... 257/331 |
| 6,084,264 A | 7/2000 | Darwish ...................... 257/332 |
| 6,140,678 A * | 10/2000 | Grabowski et al. ......... 257/341 |
| 6,429,481 B1 * | 8/2002 | Mo et al. ..................... 257/341 |
| 6,566,708 B1 * | 5/2003 | Grover et al. ............. 257/330 |

* cited by examiner

*Primary Examiner*—Chandra Chaudhari
(74) *Attorney, Agent, or Firm*—Laurence A. Greenberg; Werner H. Stemer; Ralph E. Locher (57) ABSTRACT

In order to form a MOS transistor device with a particularly low on resistance with a good avalanche strength at the same time, it is proposed to define the position and/or the configuration of avalanche breakdown regions by a variation and/or a course of the width and/or of the depth of the respective trench structure and/or of the respective mesa regions.

31 Claims, 8 Drawing Sheets

MOS TRANSISTOR DEVICE

BACKGROUND OF THE INVENTION

Field of the Invention

The present invention relates to a MOS transistor device of a trench structure or trench type, and in particular a trench MOS transistor device having an increased avalanche strength in the context of a deep trench concept.

In the ongoing development of transistor technologies, and in particular in the development of new generations of DMOS power transistors, a crucial parameter of the respective transistor devices is the on resistivity $R_{on} \cdot A$. Furthermore, the so-called avalanche strength plays a major part in many applications of transistors, and in particular of MOS power transistor devices. The avalanche strength describes, inter alia, the endeavor of the MOS transistor devices to put bipolar transistors formed in a parasitic manner under specific potential conditions into the switched-on state, as a result of which the MOS transistor can be altered or even destroyed. In this connection, increased avalanche strength results in that bipolar transistors formed in a parasitic manner will turn on with a lower probability or only in the event of higher potential differences.

SUMMARY OF THE INVENTION

It is accordingly an object of the invention to provide a MOS transistor device that overcomes the above-mentioned disadvantages of the prior art devices of this general type, which, in conjunction with a reduced on resistivity and an increased avalanche strength, is particularly simple conceptionally and in terms of production technology.

With the foregoing and other objects in view there is provided, in accordance with the invention, a MOS transistor device. The MOS transistor device contains a semiconductor region having a trench structure formed therein extending substantially in a first direction being a vertical direction. The trench structure has a lower region. An avalanche breakdown region is disposed in the lower region of the trench structure. A position and/or a configuration of the avalanche breakdown region is determined and set in at least one lateral second direction, being substantially perpendicular to the first direction, by a course of the trench structure and/or a variation of a width and/or a depth of the trench structure. The width is measured in a third direction which is substantially perpendicular to the first and second directions, and the depth is measured in the first direction, and as a result a low on resistance of the MOS transistor device is formed.

In accordance with a first solution to the object according to the invention, the MOS transistor device of the trench structure type or trench type has a trench structure with a corresponding trench. The trench structure extends essentially in a first or essentially vertical direction in a semiconductor region. According to the invention, the avalanche breakdown region of the MOS transistor device is formed in an end region or in a lower region of the trench structure. It is situated in particular in the region of the bottom of the trench structure. It is furthermore provided according to the invention that the position and/or the configuration of the avalanche breakdown region is determined and set in at least one lateral direction, essentially perpendicular to the first direction, by a course and/or by a variation of the breadth or of the width and/or of the depth of the trench structure. In this case, the term breadth or width of the trench structure relates to a third direction essentially perpendicular to the first and second directions, the variation, that is to say the change, or the course of the breadth or width of the trench structure then being present in the first and/or second direction. What is achieved by these measures according to the invention is that a particularly low on resistance of the MOS transistor device is formed or can be formed.

Consequently, a core idea of the first solution is to vary the breadth or the width and/or the depth of the trench structure and/or of the trench in order thereby to stipulate or define the position and/or the configuration of the avalanche breakdown region in the lower region of the trench structure or in an end region thereof.

As an alternative or in addition to this, a second solution is offered, according to which, in contrast to the first solution according to the invention, the position and/or the configuration of the avalanche breakdown region is determined and set in at least one lateral second direction, essentially perpendicular to the first direction, by a course and/or by a variation of the breadth or of the width of a mesa region as an adjacent region or intermediate region of the trench structure in the semiconductor region outside the trench structure. In this case, the breadth or width of the mesa region is again determined and defined in a third direction essentially perpendicular to the first and second directions. In this case, the semiconductor region outside the trench structure is designated as the mesa region. With a configuration of a plurality of MOS transistor devices, this region outside the trench structure serves as an intermediate region or adjacent region between adjacent MOS transistor devices formed in mutually separated trench structures or trenches.

Consequently, a core idea of the second solution according to the invention is to form a variation or a course of the breadth or width of the mesa region in order to define and determine the position and/or the configuration of the avalanche breakdown region.

The two solutions proposed according to the invention, namely first the variation or the course of the breadth or width and/or of the depth of the trench structure and secondly the variation or the course of the breadth or width of the mesa region, may be interpreted as alternatives, but these two solution possibilities may also be combined with one another in order to determine the position and/or the configuration of the avalanche breakdown region.

This general concept of the variation or the course of the breadth or width and/or of the depth of the trench structure and/or of the mesa region gives rise to different geometrical embodiments for realizing the concept according to the invention in the structuring of the MOS transistor device according to the invention, and in particular in the structuring of the trench structure and/or of the mesa region.

In accordance with a particularly advantageous refinement of the MOS transistor device according to the invention, it is provided that the position and/or the configuration of the avalanche breakdown region is defined or formed by at least one region or in at least one region of a reduced breadth or width of the mesa region. The formation of a region with a smaller mesa breadth or mesa width thus generates a potential or field distribution that defines and stipulates the position and/or the configuration of the avalanche breakdown region of the MOS transistor device according to the invention.

The region of reduced mesa breadth or mesa width can be achieved by various measures. First, directly influencing the mesa region itself is a possibility. In accordance with another preferred embodiment of the MOS transistor device according to the invention, however, it is provided that the region of a reduced breadth or width of the mesa region is formed by a complementary region with an increased breadth or width of the trench structure. What is intended, in particular, in this case is that, in the case of a strip-type configuration of the trench structure or of the trench with mesa regions likewise running parallel and adjacent thereto, in practice the trench is broadened and a region with an increased breadth or width of the trench structure is thus formed. On account of this bulge or the region with an increased breadth or width of the trench structure, correspondingly, unless particular other measures are taken, the mesa region itself is constricted in such a way as to produce a region with a reduced mesa breadth or mesa width that is formed in a manner complementary to the broadening of the trench structure or of the trench.

Particularly when a plurality of MOS transistor devices in the region of a semiconductor circuit configuration or transistor configuration are formed in mutually separate trench structures or trenches in a common semiconductor region, through a choice of the geometry of the trench structures, the courses thereof afford configuration options for the mesa region. Thus, it is provided that the region of a reduced breadth or width of the mesa region is formed by a region of a variation of the course or course direction of the trench structure. In this case, the trench structure itself may have, in particular, a constant breadth or width. Therefore, by virtue of the course of the trench or of the trench structure, which is formed in an unchanged manner locally as a strip, and by changing the course direction of the strip, it is possible to produce indentations or protuberances in the mesa region without influencing the breadth or width of the trench itself. This measure is appropriate particularly when, as already mentioned above, a plurality of trenches are formed adjacent to one another in a common semiconductor region. The adjacent trenches can then either run parallel to one another or run locally toward one another in order to form regions of reduced mesa breadth or mesa width, or they can run locally moving away from one another in order to form regions of an increased mesa breadth or mesa width.

The positions and/or the configuration of the avalanche breakdown region can also be influenced by other measures. Thus, one possibility, for example, is to form different contacts, which are necessary for the operation of the MOS transistor device according to the invention, at specific positions on or in the semiconductor region. As a result, the potential distribution, the field distribution and/or the corresponding current flows, that is to say charge movements, can be advantageously influenced.

Accordingly, in another advantageous development of the invention, it is provided that, in the region of a reduced breadth or width of the mesa region and/or in a vicinity thereof on the semiconductor region, a contact region for a body region provided in the semiconductor region, and in particular in the mesa region, is formed. The formation of this contact region for the body region may be effected locally, but it is also possible to provide so-called body contact strips which run in particular essentially perpendicular to the course direction, that is to say the second direction of the trench structure, that is to say in particular in the third direction, which runs essentially vertically with respect to the first and second directions.

The MOS transistor device according to the invention advantageously has a source region and a drain region, which are formed in a semiconductor region with a first conductivity type. A gate electrode device is provided essentially between the source region and drain region in a manner insulated by an insulation region.

A preferred embodiment provides for the avalanche breakdown region to be formed by a region of maximum electric field strength or to be defined by the region.

This can be ensured for example through the corresponding configuration of the source and/or drain terminals and/or the proximity to other components, because generally the respective MOS transistor device is not situated by itself in the respective semiconductor region, but rather is in direct proximity to other semiconductor devices, for example other transistors or the like.

In this case, the region of maximum electric field strength may be formed, in particular, in accordance with a preferred embodiment of the invention, between the source region and the drain region in direct proximity to the insulation region and in direct proximity to the end region or lower region of the trench structure in a manner remote from the gate electrode.

In particular, the region of maximum electric field strength in this case lies directly on the outside of the trench wall in the lower region of the trench structure, that is to say for example in the vicinity of the trench bottom.

In another embodiment of the MOS transistor device according to the invention, it is provided that the region of maximum field strength is formed between the source and drain regions in direct proximity to the end region or lower region of the trench structure and in a manner remote from the gate electrode device. This is done preferably in the region of a space charge zone, which extends, in particular, between a provided body region or a provided body reinforcement region and the drain region, in particular given the presence of a breakdown voltage, and there in the second, lower half, or half facing the drain region, thereof.

In a particularly preferred embodiment of the MOS transistor devices according to the invention, it is provided that the mesa region as an intermediate region, in a direction running essentially perpendicular to the first direction, in particular toward an adjacent semiconductor device, has a width $D_{mesa}$ which is less than the width $D_{trench}$ of the trench structure or of the trench itself in this direction, so that the following holds true: $D_{mesa} < D_{trench}$. This measure of narrowing the mesa width and thus of closer proximity between adjacent components therefore not only results in a higher integration density of the semiconductor components, but also brings about the reduction of the on resistances of MOS transistor devices according to the invention.

In a further preferred embodiment, it is provided that the mesa region as an intermediate region, in a direction running essentially perpendicular to the first direction, in particular toward a semiconductor device provided adjacent, has a breadth $D_{mesa}$ which is less than 2.5 times the maximum thickness $D_{GOX}$ of the gate insulation region GOX, so that the following holds true: $D_{Mesa} < 2.5 \cdot D_{GOX}$.

It must be taken into account in this case that the mesa breadth $D_{mesa}$ is permitted to be restricted only to the extent allowed by the interaction of adjacent semiconductor devices or semiconductor components. The electric fields of adjacent semiconductor components that are separated by the mesa region respectively provided must not influence one another in such a way as to result in a negative tendency with regard to the breakdown voltage.

The last-mentioned measure of relating the mesa breadth to the maximum thickness of the insulation region or of the gate insulation can be utilized particularly advantageously when the MOS transistor device according to the invention is formed as a field plate transistor device, the insulation region having a field plate structure.

In this case, it is particularly advantageous if, in regions of mesa constrictions, a field oxide (FOX) is provided in the trench. This makes it possible to increase the avalanche strength and reduce the capacitances that are responsible for switching losses during fast switching. In this case, the thickness of the field oxide (FOX) is significantly greater than the thickness of the gate oxide (GOX) in the upper region of the trench.

It is furthermore provided that a body region of a second conductivity type is formed essentially between the source region and the drain region in a manner insulated from the gate electrode device, in particular in direct proximity to the source region.

In this case, it is provided that the body region is formed in a manner reinforced toward the drain region with a body reinforcement region of the second conductivity type.

In a further advantageous embodiment of the MOS transistor device according to the invention, it is provided that the trench structure is formed in a manner reaching approximately as far as the first semiconductor lower region of the semiconductor region, as far as the substrate and/or right into the substrate of the MOS transistor device.

These and further aspects of the present invention are now further explained.

In the development of new generations of MOS or DMOS power transistors, an important aim is to reduce the on resistivity $R_{on} \cdot A$. This makes it possible, on the one hand, to minimize the static power loss. On the other hand, it is possible to achieve higher current densities, as a result of which smaller and less expensive chips can be used for the same total current.

Furthermore, very good avalanche strength is required for many applications. A very low $R_{on} \cdot A$ is generally bought at the expense of a somewhat lower avalanche strength and, conversely, components having outstanding avalanche strength do not usually have the best $R_{on} \cdot A$ values. A very low $R_{on} \cdot A$ can be achieved through the concept of the dense field plate trench. Achieving high avalanche strength in the case of dense field plate trench transistors depends to a great extent on the body contact concepts used.

The layout idea proposed enables an improvement in the avalanche strength in conjunction with a constant or even slightly improved $R_{on} \cdot A$ within a transverse strip body contact concept.

In this case, a first body contact concept is based on a body contact formed along the trench strips. This variant is the best embodiment with regard to the avalanche strength since the charge carriers generated in the avalanche at the trench bottom can be conducted away on a very short path via the entire trench strip length. Thus, there is no transverse conduction resistance drop within the body region. However, this variant is the technologically most risky and most expensive embodiment.

By contrast, a second body contact concept is a technologically less risky and less expensive concept, which is why it is preferred at the present time. It provides for the body contact to be embodied in transverse strips with respect to the trench strips. In this case, however, the spacing between the body contact transverse strips is a critical quantity; it determines the distance along which the charge carriers generated in the avalanche have to flow transversely through the body region. If this distance is too large, then there is the risk of a sufficiently high voltage being dropped in the body region, so that the parasitic bipolar transistor can switch on and leads to the destruction of the component. The component would not have sufficient avalanche strength in this case. Therefore, the body contact strips have to be embodied with sufficiently close spacings in the second body contact concept. However, this requires chip area that is lost for the channel width and thereby impairs the $R_{on} \cdot A$.

The invention proposes, within the dense field plate trench concept, to vary the trench width and/or the mesa width along the trench strips in such a way that, as a result preferred avalanche breakdown locations form at the trench bottom along the trench strips in each case in the regions in which the mesa width is smallest. This is due to the fact that the preferred avalanche breakdown locations, at which the mesa width is somewhat smaller than in the standard layout, have a breakdown voltage that is lower by a plurality of volts. The body contacts are to be disposed directly above the preferred avalanche breakdown locations, preferably at the Si surface, so that the charge carriers generated in the avalanche can be extracted from the body contact on the shortest possible path through the body region. The thus constrained formation of the avalanche current path enables larger spacings between the body contact strips relative to the standard layout, which leads to a reduction of the $R_{on} \cdot A$.

One inventive idea resides in forming preferred avalanche breakdown locations at the trench bottom along the trench strips by targeted variation of the trench width or mesa width (trench layout).

An additional or alternative inventive idea resides in forming the body contact regions directly above the preferred avalanche breakdown locations (body contact layout) in such a way as to produce the shortest possible avalanche current paths and thus increased avalanche strength.

In this case, the mesa region must be small enough so that the location of the maximum field strength is situated in the trench bottom region. Within this regime, a reduction of the mesa width or increase in the trench width brings about a reduction of the breakdown voltage by up to approximately 10%.

A particularly short possible avalanche current path results from positioning the body contact regions directly above the preferred avalanche breakdown locations.

By way of example, the following possibilities result for the variation of the layout: layout in which the trench width is varied, layout in which the mesa width is varied. The form of the trench width or mesa width variation is arbitrary; the minimum remaining trench width or mesa width is adapted to the respective voltage class of the trench transistors.

In the most general embodiment, the trench is embodied as a standard trench with uniform oxide thickness.

In a further general embodiment, the trench is embodied as a standard trench, and it is possible to vary both the trench width and/or the trench depth in such a way as to produce preferred avalanche breakdown locations. The body contact is then disposed directly above the preferred avalanche breakdown locations thus defined, e.g. in the case of the standard trench, with variation of the trench depth, above those locations at which the trench depth is a maximum or minimum.

Other features which are considered as characteristic for the invention are set forth in the appended claims.

Although the invention is illustrated and described herein as embodied in a MOS transistor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
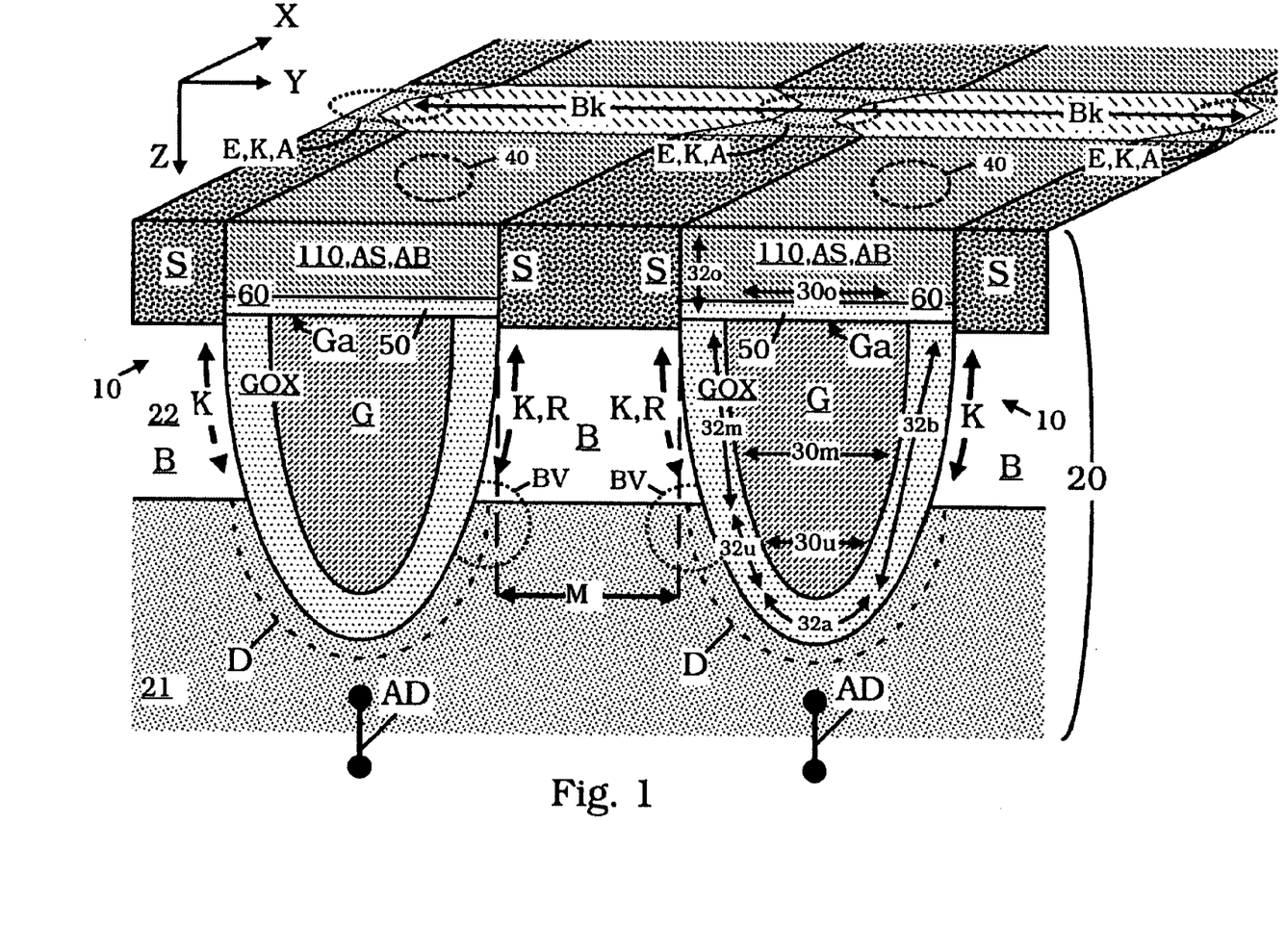
FIG. 1 is a diagrammatic, sectional and perspective view of an embodiment of the MOS transistor device according to the invention.

Referring now to the figures of the drawing in detail and first, particularly, to FIG. 1 thereof, there is shown a diagrammatic, sectional and perspective view of a detail from a semiconductor circuit configuration having two semiconductor components 10 according to the invention, which are formed as so-called trench MOSFETs 10.

The illustration shows a semiconductor substrate region 20 containing two semiconductor regions 21, e.g. silicon n⁻-doped with phosphorus, and 22, e.g. p⁻-doped silicon. Trenches 30 are introduced into the semiconductor substrate region 20 and are filled with corresponding material combinations in order to form a MOSFET.

The original trenches 30 contain an upper trench section 30o, a middle trench section 30m and a lower trench section 30u. Each trench section 30o, 30m, 30u has a corresponding upper, middle and lower wall section 32o, 32m, and 32u, respectively, of a wall region 32b of the trench 30. Furthermore, a bottom region 32a of the trench 30 is formed. All the wall regions 32o, 32m and 32u and the bottom region 32a are lined conformally with an insulation region, namely a so-called gate oxide GOX. A polysilicon n⁺-doped, e.g. by phosphorus, is filled into the remaining free space as a so-called plug. The filling serves as a gate G of a respective conventional semiconductor component as a MOSFET. The gate G, also designated as a third contact region G in the nomenclature below, is externally contact-connected via a corresponding terminal region or fourth terminal region and has a corresponding control voltage applied to it during operation.

Figure 8A:
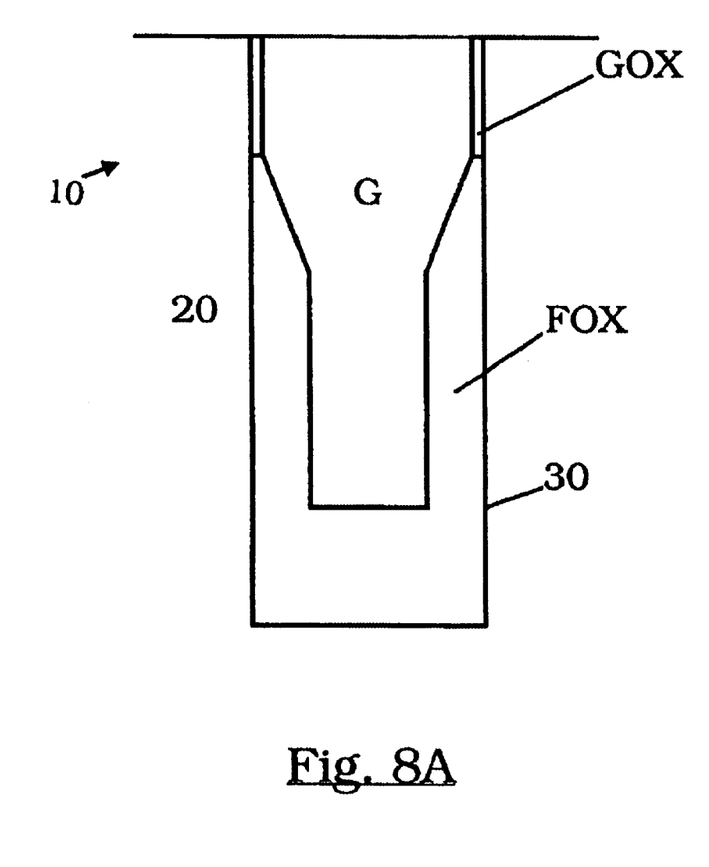
FIGS. 8A and 8B are diagrammatic sectional views of a trench with a gate oxide (FIG. 8A) and a trench with a field oxide (FIG. 8B).
Figure 8B:
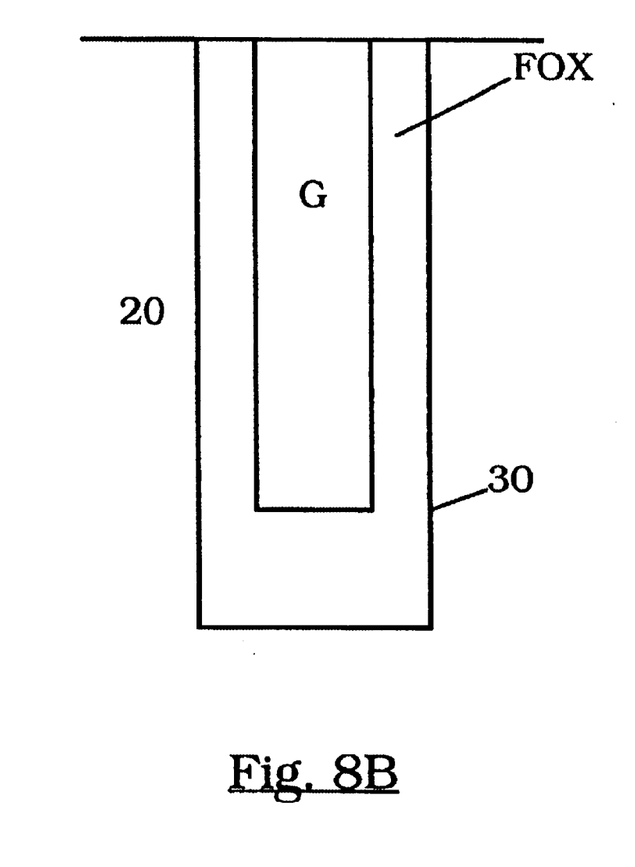

In the case of a field plate transistor, the trenches 30 may have the structure shown in FIGS. 8A and 8B with the gate oxide GOX and a field oxide FOX, which is significantly thicker than the latter. In this case, only the field oxide FOX, as shown in FIG. 8B, is preferably provided in regions of mesa constrictions and/or in a vicinity thereof. Otherwise, the structure shown in FIG. 8A may be present, in the case of which the gate oxide GOX in the upper region of the trench 30 is significantly thinner than the field oxide FOX in the lower region of the trench.

Outside the respective trench 30, provision is made of terminals AS, AB, AD for source S, body B or substrate B and drain D which are also designated as first, second and fourth contact regions S, B and D respectively in the nomenclature below.

By a common metallization and e.g. the corresponding p⁺-type doping by boron in an intermediate region M between the adjacent semiconductor components 10, a common terminal region AS and AB is produced for the source contact region S and the body contact region B.

The intermediate region or mesa region M between the conventional semiconductor components, which is also designated as a silicon mesa or a mesa structure, assumes a minimum extent that cannot be undershot on account of the process accuracy which can be achieved at present and on account of the configuration of the terminal regions AS and AB for the source S and the body B between the semiconductor components 200. This is also associated with the fact that a contact hole 40 to be formed has a minimum size, the contact hole 40 being necessary for the processing of the terminal regions AS and AB. Furthermore, the positions and extents of the trenches 30 of the gate oxide GOX and of further insulation regions 50 are provided with fluctuations on account of the customary process implementations.

It is pointed out that the mesa structure between adjacent semiconductor components 10 according to the invention has a very much smaller lateral extent in comparison with the mesa structure of conventional configurations with conventional semiconductor components: M'<M.

This is achieved according to the invention by virtue of the fact that at least some of the terminal regions AS and AB for the source contact regions S and body contact regions B as first and second contact regions S and B, respectively of the semiconductor components 10 according to the invention are placed into the interior of the respective trench 30, and, if appropriate, into the region above that.

In the embodiment of FIG. 1, the height of the polysilicon plug G as the gate contact region G is lowered almost down to the level of the interface between the source contact region S and the body contact region B. Furthermore, a further oxide layer 60 as an insulation region 60 is deposited on a surface region Ga of the gate contact region G for the purpose of electrical insulation. A further, possibly doped, polysilicon layer 110 is then formed in order to form the common terminal regions AS and AB for the source contact regions S and body contact regions B. The polysilicon layer 110 as a terminal region AS for the source contact region S is in direct contact with the source contact region S, so that the latter is directly connected and contact-connected.

The contact connection between the common terminal region AS, AB, namely the polysilicon region 110, and the body contact region B as second contact region takes place e.g. by a corresponding p⁺-doped body contact strip Bk, which is provided in localized form in a manner offset laterally towards the rear perpendicular to the course of the respective trench 30. As a result of the succession, for example, in equidistant form, of a plurality of such body contact strips Bk which are formed in a manner offset toward the rear in the plane of the drawing, the trench 30 extending along the plane of the drawing is thus subdivided into a multiplicity of successive semiconductor components 10 according to the invention or MOSFET transistors 10 according to the invention.

In the surface region of the semiconductor region 20, the illustration of FIG. 1 illustrates regions E of a reduced breadth $D_{mesa}$ of a mesa breadth or mesa width (mesa constrictions), which are formed complementarily by corresponding complementary regions K of an increased trench breadth or trench width $D_{trench}$. With these regions E and K of the reduced mesa breadth and of the increased trench breadth, respectively, the illustration also shows regions A of the avalanche breakdown, or the projection thereof at the region of the surface of the semiconductor substrate 20, because the avalanche breakdowns themselves—as has already been set forth in detail above—take place in the region of a lower section 32u or 30u of the trench wall or of the trench 30.

In addition to or instead of the variation of the trench breadth, it is also possible to vary the depth of the trench in order to set the avalanche breakdown region.

Figure 2:
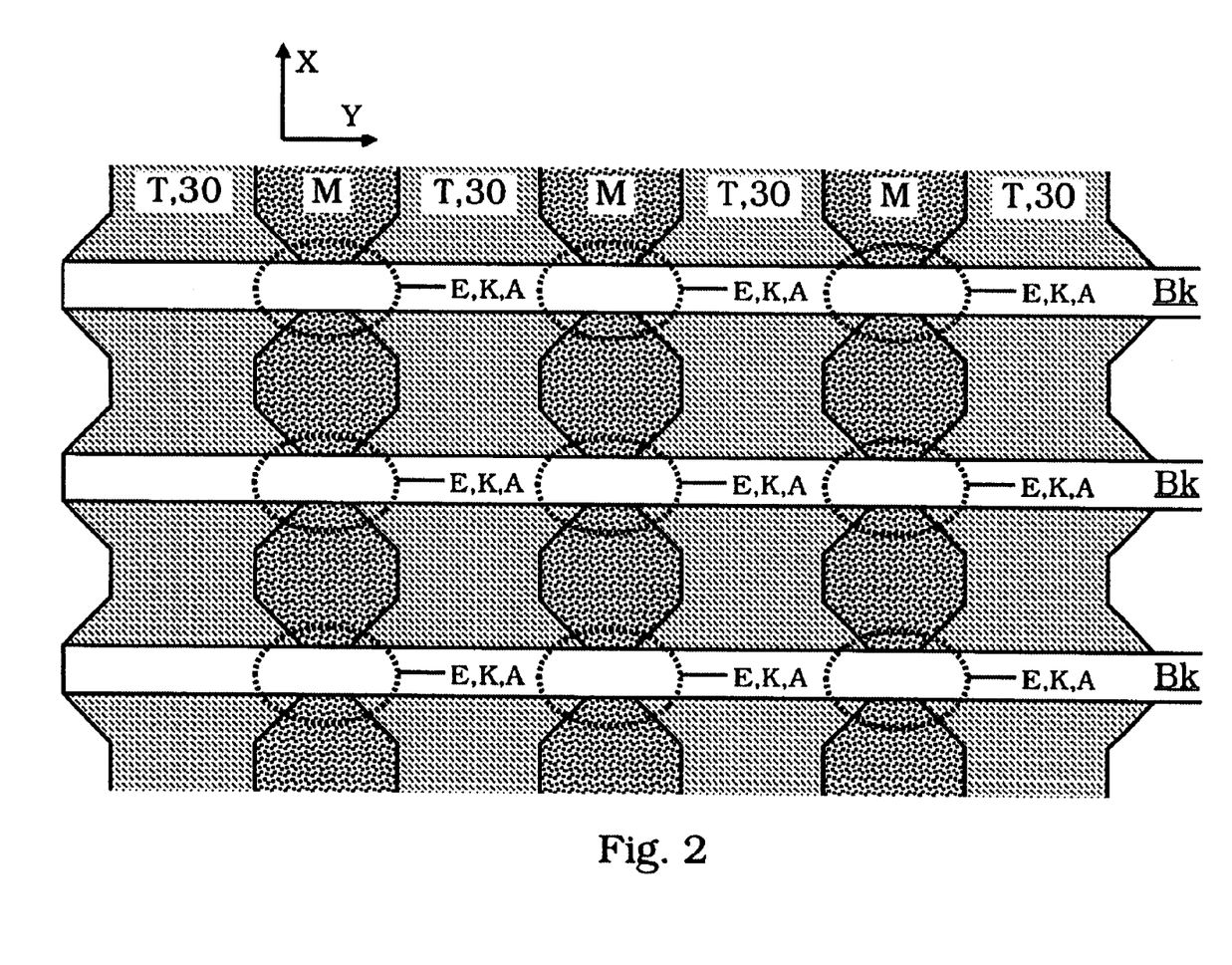
FIGS. 2 and 3 are plan views showing mesa and trench layouts according to the invention.
Figure 3:
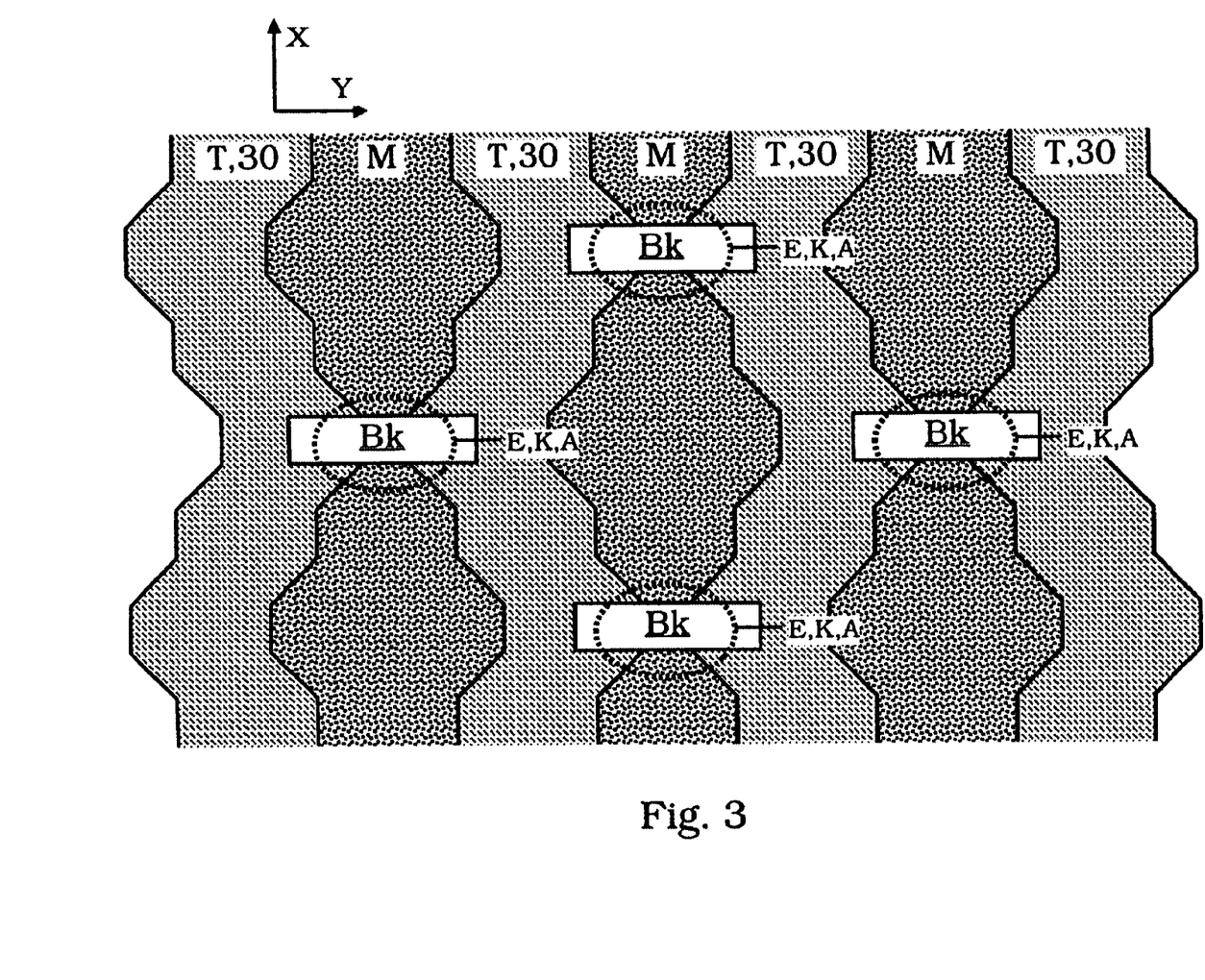

FIGS. 2 and 3 show diagrammatic plan views of the course of the trench structures 30 or trenches T and of the mesa regions M in two different MOS transistor devices according to the invention, identical reference symbols designating identical or identically acting elements or structures without a detailed description being repeated at every point at which they occur.

The embodiment of FIG. 2 essentially reflects the conditions of the embodiment of FIG. 1, a plurality of trenches T or trench structures 30 being disposed in a manner running parallel to one another in an X direction. The mesa regions M are in each case provided between directly adjacent trenches T or trench structures 30. Running perpendicularly to the X direction, that is to say in the Y direction, are body contact strips Bk for the contact connection of corresponding body regions in the semiconductor region 20. The body contact strips Bk are disposed and formed such that they rest above the avalanche breakdown regions A, the position or configuration of which, in the embodiment of the MOS transistor device according to the invention as shown in FIG. 2, is defined by regions E of a reduced mesa width and regions K of an increased trench breadth which are complementary with respect thereto.

In the embodiment of FIG. 3, the body contact regions Bk are not formed as body contact strips, but rather as local metallizations. The latter are again situated above the avalanche breakdown regions A, which is to say in the region of the projection thereof onto the surface region of the semiconductor substrate 20. Here, too, the avalanche breakdown regions A or the position and/or configuration thereof in the semiconductor region 20 are determined and defined by regions E of a reduced mesa width or mesa breadth. In this case, however, the trenches are provided with an essentially constant trench breadth or trench width, and the regions E with a reduced mesa breadth or mesa width are formed by regions K with an altered course direction of the respective trench T or of the respective trench structure 30. Wherever two directly adjacent trenches T or trench structures 30 run toward one another in their course, what is produced is a region E with a reduced mesa breadth or mesa width and, consequently, within the semiconductor region 20, in the region of a lower section of the trench 30, an avalanche breakdown region A. Regions with a reduced mesa breadth or mesa width, in which no avalanche breakdown is realized, are produced in regions of adjacent trenches T or trench structures 30 that diverge from one another.

Figure 4:
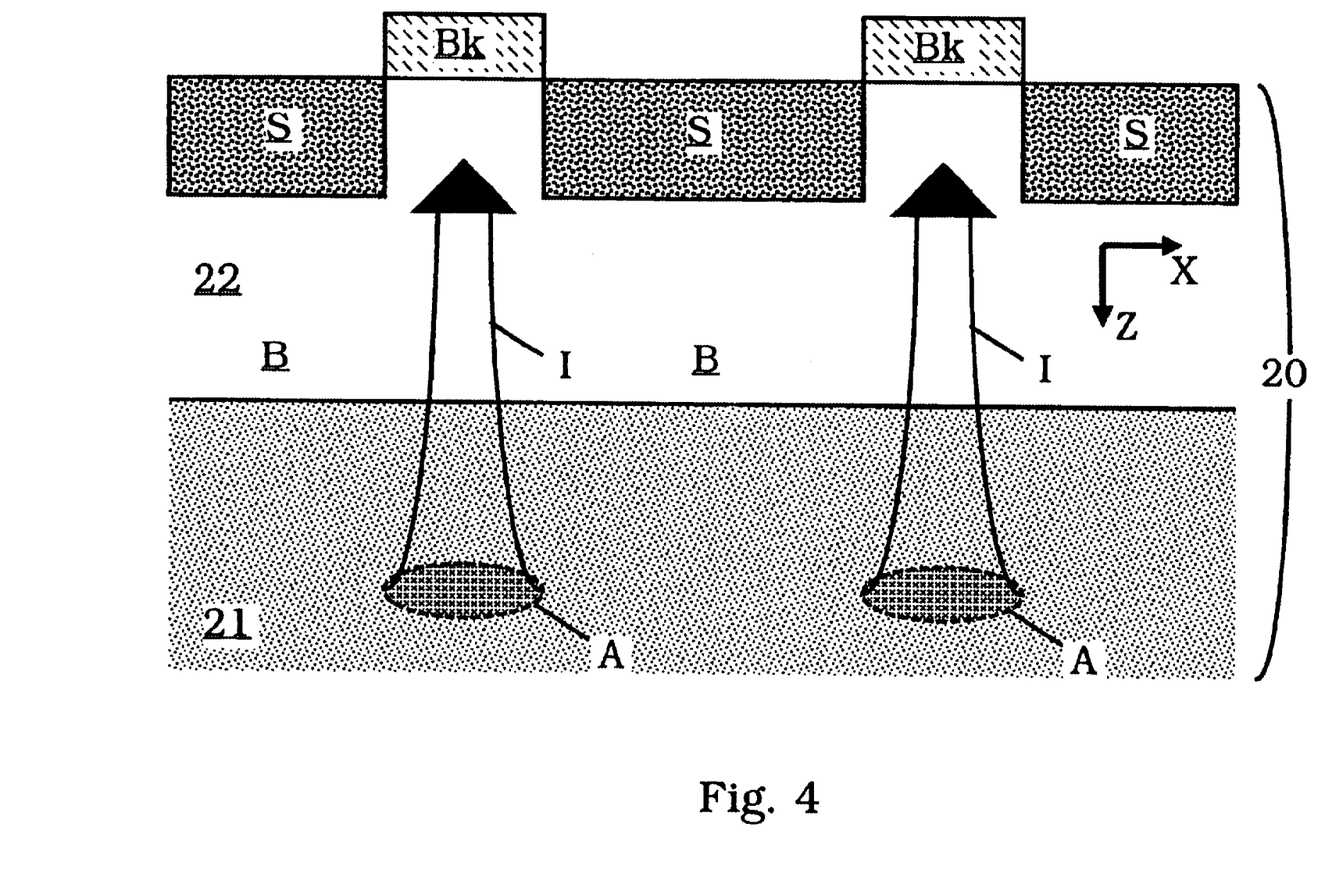
FIG. 4 is a diagrammatic, sectional side view of avalanche breakdown regions and avalanche current paths in an embodiment of the MOS transistor device according to the invention.

FIG. 4 uses a diagrammatic cross-sectional view of a MOS transistor device according to the invention to show the positioning and configuration of the avalanche breakdown regions A within the semiconductor region 20, to be precise below the body contact regions Bk, which are disposed on the surface region of the semiconductor region 20, namely between adjacent source regions S. During the avalanche breakdown, the avalanche current path I is effected from the avalanche regions A, concentrated and localized in the X direction, toward the body contact regions Bk disposed directly above the latter.

Figure 5:
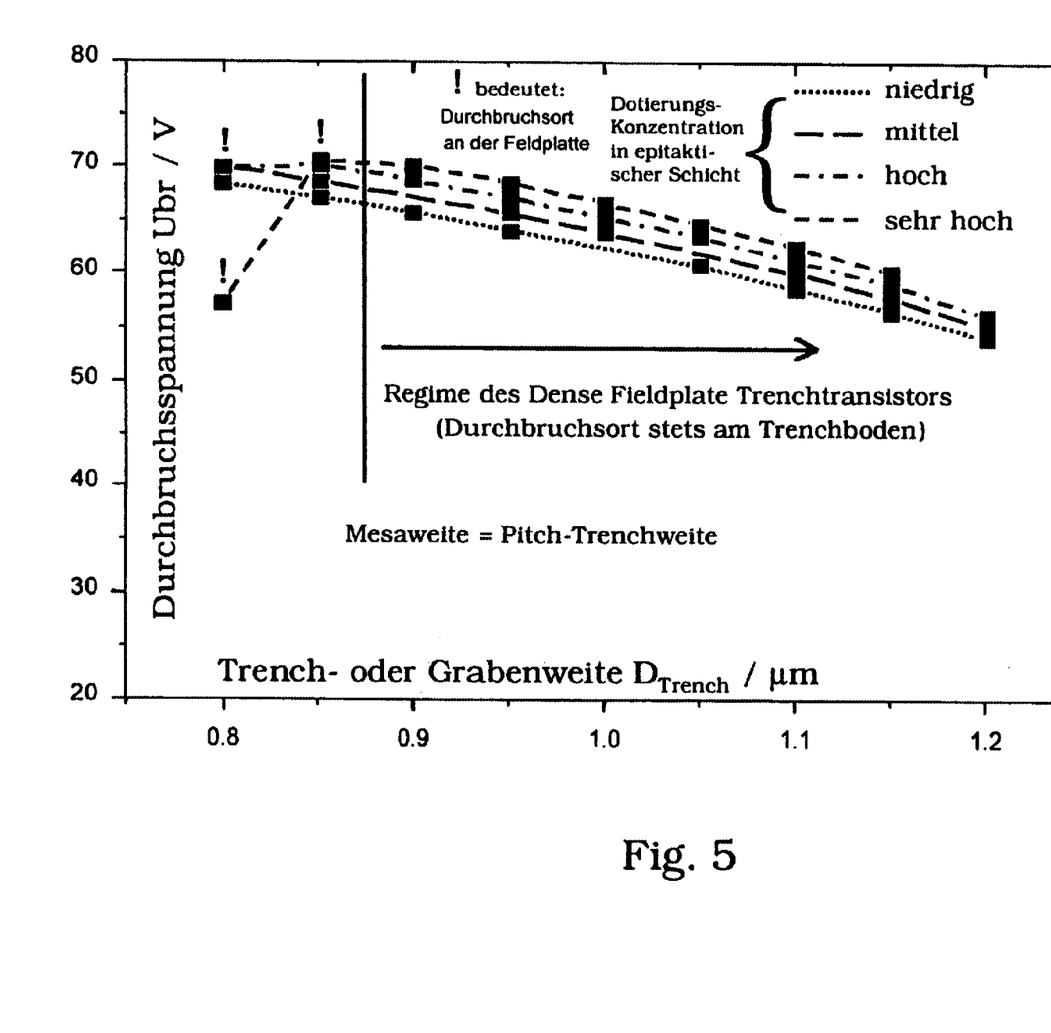
FIG. 5 is a graph showing the breakdown voltage in a MOS transistor device according to the invention as a function of the trench width with a variation of the dopant concentration in the epitaxial region.

The graph of FIG. 5 shows the dependence of the breakdown voltage Ubr as a function of the trench breadth $D_{trench}$. In this case, the individual measurement points designate the breakdown voltage Ubr for a given trench breadth $D_{trench}$. In this case, the mesa width or mesa breadth results from the cell extent or the pitch minus the trench breadth or trench width.

It is apparent that the breakdown voltage Ubr of the trench transistor decreases with decreasing mesa breadth $D_{mesa}$, that is to say increasing trench breadth $D_{trench}$ and with increasing doping concentration Epi in the epitaxial region, in which case, below a specific trench breadth $D_{trench}$ or above a specific mesa breadth $D_{mesa}$, the regime of the breakdown location at the trench bottom is left and the breakdown location is effected outside the bottom region, in the region of the field plate in the case of a field plate transistor.

Figure 6:
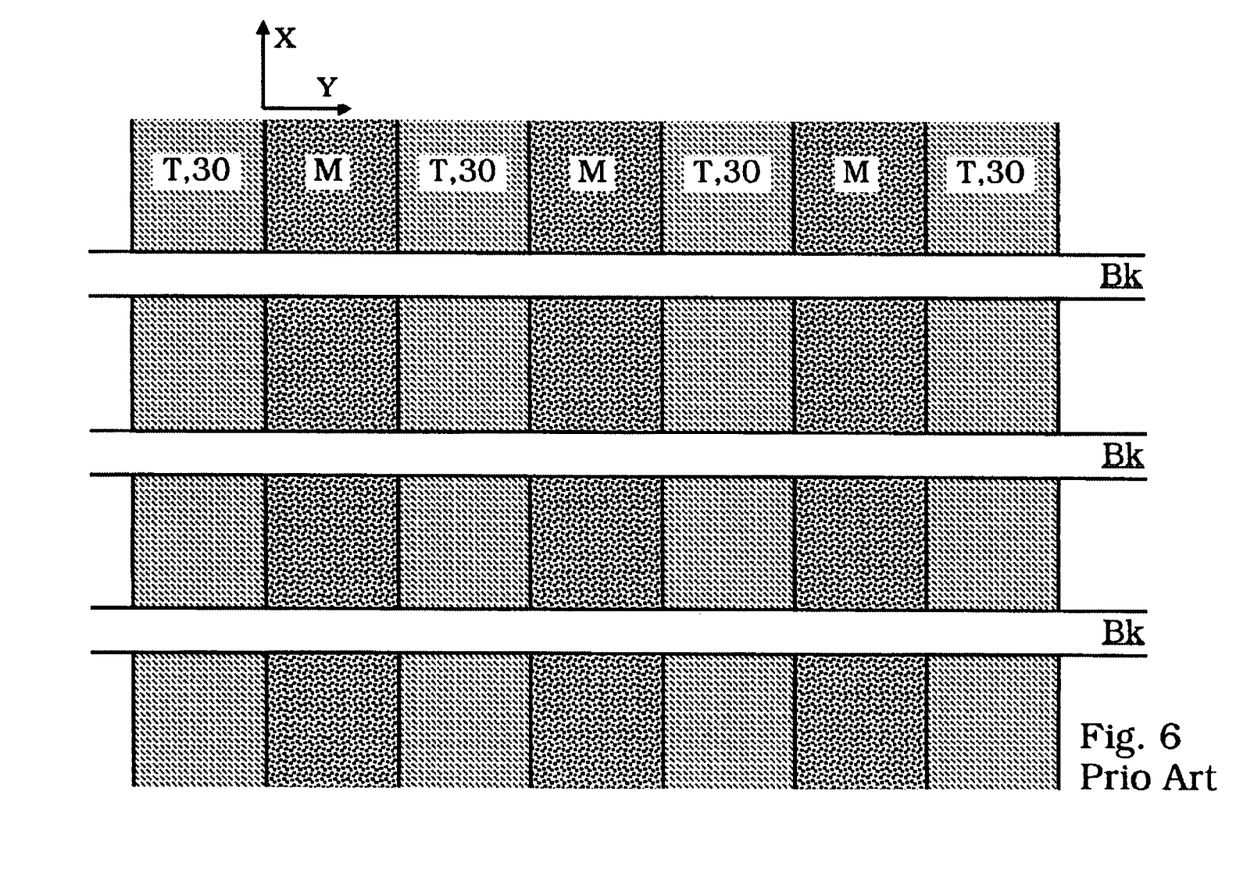
FIG. 6 is a plan view of a conventional mesa and trench layout.

FIG. 6 shows a conventional mesa trench layout, the trench structures 30 or trenches T with the mesa regions M disposed in between being formed parallel to one another and equidistant from one another and adjacent to one another, so that the course direction of the mesa regions M and of the trench structures 30 is effected in an X direction, and the succession of trench structures 30 and mesa regions M is effected in a Y direction perpendicular thereto. The corresponding body contact strips Bk are formed in a manner running equidistantly in the X direction and parallel to one another in the Y direction.

Figure 7:
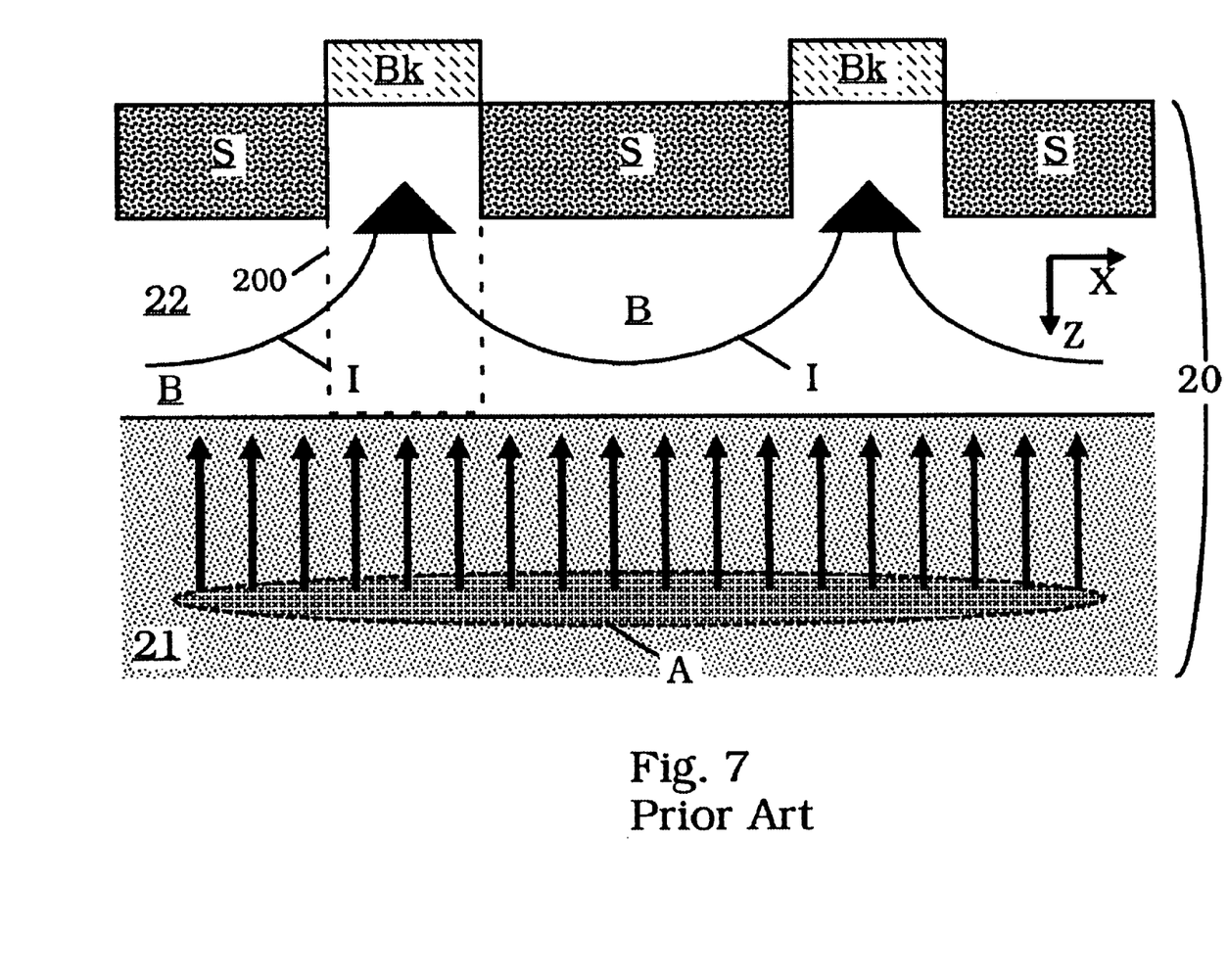
FIG. 7 is a diagrammatic, sectional side view, of avalanche breakdown regions and avalanche current paths in a MOS transistor device with a conventional mesa and trench layout.

The conventional trench mesa configuration shown in FIG. 6 results in the course—described with a diagrammatic cross-sectional view in FIG. 7—of the avalanche current path I' from a broadened avalanche breakdown region A' first on a broad front to the body region B and then in gathered fashion to the body contact strips Bk provided.

We claim:

1. A MOS transistor device, comprising:
    a semiconductor region having a trench structure formed therein extending substantially in a first direction being a vertical direction, said trench structure having a lower region; and
    an avalanche breakdown region disposed in said lower region of said trench structure, at least one of a position and a configuration of said avalanche breakdown region being determined and set in at least one lateral second direction, being substantially perpendicular to the first direction, by one at least one of a course of the trench structure and a variation of at least one of a width and a depth of the trench structure, the width being measured in a third direction being substantially perpendicular to the first and second directions, and the depth being measured in the first direction, and as a result forming a low on resistance of the MOS transistor device.

2. The MOS transistor device according to claim 1, wherein said semiconductor region having a mesa region being one of a region to adjacent to said trench structure and an intermediate region of said trench structure, at least one of said position and said configuration of said avalanche breakdown region is determined and set in the lateral second direction by at least one of a course of said mesa region and a variation of a width of said mesa region, said width being measured in the third direction.

3. The MOS transistor device according to claim 1, wherein said trench structure has a bottom region and said avalanche breakdown region is disposed in said bottom region.

4. A MOS transistor device, comprising:
a semiconductor region having a trench structure formed therein extending substantially in a first direction being a vertical direction into said semiconductor region, said semiconductor region further having a mesa region disposed one of adjacent to said trench structure and being an intermediate region of said trench structure, said trench structure having a lower region; and
an avalanche breakdown region formed in said lower region of said trench structure, at least one of a position and a configuration of said avalanche breakdown region being determined and set in at least one lateral second direction, being substantially perpendicular to the first direction, by at least one of a course and a variation of a width of said mesa region, said width being measured in a third direction being substantially perpendicular to the first and second directions, and as a result forming a low on resistance of the MOS transistor device.

5. The MOS transistor device according to claim 4, wherein said position and said configuration of said avalanche breakdown region is further determined and set in the lateral second direction, by at least one of a course and a variation of at least one of a width and a depth of said trench structure, said width being measured in the third direction, and said depth being measured in the first direction.

6. The MOS transistor device according to claim 4, wherein said mesa region has at least one region with a reduced width, and at least one of said position and said configuration of said avalanche breakdown region is one of defined by and formed by said region with said reduced breadth.

7. The MOS transistor device according to claim 6, wherein said trench structure has a region of increased width, said region with said reduced width of said mesa region is formed complementary to said region of increased width of said trench structure.

8. The MOS transistor device according to claim 6, wherein said region with said reduced width of said mesa region is defined by a region of a variation of said course of said trench structure.

9. The MOS transistor device according to claim 6, further comprising a contact region for a body region disposed one of in said region with said reduced width of said mesa region and in a vicinity thereof in said semiconductor region, said contact region formed at least one of as a body contact strip and disposed substantially perpendicularly to a course direction of said trench structure.

10. The MOS transistor device according to claims 4, further comprising:
a source region of a first conductivity type formed in said semiconductor region;
a drain region of said first conductivity type formed in said semiconductor region;
an insulation region; and
a gate electrode device formed substantially in an interior of said trench structure in a manner insulated by said insulation region.

11. The MOS transistor device according to claim 10, wherein said avalanche breakdown region is one of formed by a region of maximum electric field strength and defined by said region of maximum electric field strength.

12. The MOS transistor device according to claim 11, wherein said region of maximum electric field strength is formed between said source region and said drain region in direct proximity to said insulation region and to said lower region of said trench structure in a manner remote from said gate electrode device.

13. The MOS transistor device according to claim 11, wherein said region of maximum electric field strength is formed between said source region and said drain region in direct proximity to said lower region of said trench structure and in a manner remote from said gate electrode device.

14. The MOS transistor device according to claim 5, wherein said mesa region as said intermediate region, in a direction running substantially perpendicular to the first direction, has a width $D_{mesa}$ which is less than said width $D_{trench}$ of said trench structure in the first direction, such that $D_{mesa} < D_{trench}$.

15. The MOS transistor device according to claim 4, wherein said mesa region as said intermediate region, in a direction running substantially perpendicular to the first direction and has a width $D_{mesa}$ which is less than 2.5 times a maximum thickness $D_{GOX}$ of said insulation region, such that: $D_{mesa} < 2.5 \cdot D_{GOX}$.

16. The MOS transistor device according to claim 10, further comprising a body region of a second conductivity type disposed substantially between said source region and said drain region in a manner insulated from said gate electrode device.

17. The MOS transistor device according to claim 16, wherein said body region is formed in a manner reinforced toward said drain region with a body reinforcement region of said second conductivity type.

18. The MOS transistor device according to claim 4, wherein said semiconductor region has a first lower region and a second lower region, and said trench structure reaching into said first lower region of said semiconductor region.

19. The MOS transistor device according to claim 4, further comprising a plurality of electrode devices disposed in said the trench structure.

20. The MOS transistor device according to claim 18, further comprising a source terminal region connected to said source region;
further comprising a drain terminal region connected to said drain region, said drain region being formed, to avoid a rear-side contact connection of said semiconductor region to a greatest possible extent, on a same side of said semiconductor region as one of said source region and said source terminal region; and
wherein said first lower region being formed, as a terminal region and in a laterally offset manner extending to a surface region of said semiconductor region and to a surface of said second lower region.

21. The MOS transistor device according to claim 10, wherein the MOS transistor device is a field plate transistor device, and said insulation region has a field plate structure.

22. The MOS transistor device according to claim 21, further comprising a field oxide formed in said insulation region.

23. The MOS transistor device according to claim 22, wherein a thickness of said field oxide is greater than a thickness of said gate oxide in an upper region of said trench structure.

24. The MOS transistor device according to claim 4, wherein said trench structure has a bottom region and said avalanche breakdown region is disposed in said bottom region.

25. The MOS transistor device according to claim 8, wherein said region with said reduced width of said mesa region is defined by a region of said trench structure having a substantially constant width.

26. The MOS transistor device according to claim 13, further comprising:
 a body region disposed in said semiconductor region; and
 a region of a space charge zone formed in a presence of a breakdown voltage between said body region and said drain region, said region of maximum electric field strength disposed in said region of said space charge zone.

27. The MOS transistor device according to claim 10, further comprising a body region of a second conductivity type disposed substantially between said source region and said drain region in a manner insulated from said gate electrode device and in direct proximity to said source region.

28. The MOS transistor device according to claim 19, wherein said electrode devices include at least one of a plurality of gate regions and a plurality or source regions.

29. The MOS transistor device according to claim 20, wherein said first lower region is doped.

30. The MOS transistor device according to claim 22, wherein said mesa region has at least one region with a reduced width and said field oxide is formed in said trench structure adjacent to said region with said reduced width.

31. The MOS transistor device according to claim 19, wherein said contact region is disposed in said mesa region.

* * * * *